United States Patent
Carey et al.

(10) Patent No.: US 6,204,523 B1
(45) Date of Patent: Mar. 20, 2001

(54) HIGH STABILITY OPTICAL ENCAPSULATION AND PACKAGING FOR LIGHT-EMITTING DIODES IN THE GREEN, BLUE, AND NEAR UV RANGE

(75) Inventors: Julian A. Carey, Sunnyvale; William David Collins, III; Jason L. Posselt, both of San Jose, all of CA (US)

(73) Assignee: Lumileds Lighting, U.S., LLC, San Jose, CA (US)

( * ) Notice: Subject to any disclaimer, the term of this patent is extended or adjusted under 35 U.S.C. 154(b) by 0 days.

(21) Appl. No.: 09/187,357

(22) Filed: Nov. 6, 1998

(51) Int. Cl.[7] .................................................. H01L 33/00
(52) U.S. Cl. ........................ 257/98; 257/100; 257/99; 257/790; 257/791; 313/502
(58) Field of Search ....................... 257/98–100, 790, 257/791; 313/502

(56) References Cited

U.S. PATENT DOCUMENTS

| | | |
|---|---|---|
| 4,478,588 | 10/1984 | Lockhard . |
| 5,514,627 * | 5/1996 | Lowery et al. ........................ 438/26 |
| 5,648,687 * | 7/1997 | Matsuo et al. ........................ 257/791 |
| 5,813,753 * | 9/1998 | Vriens et al. ........................ 362/293 |
| 5,910,661 * | 6/1999 | Colvin et al. ........................ 250/573 |

FOREIGN PATENT DOCUMENTS

| | | |
|---|---|---|
| 0420629A1 | 9/1990 | (EP) . |
| 0864432A2 | 3/1998 | (EP) . |
| 1497115 | 3/1975 | (GB) . |
| 030119769 | 5/1991 | (JP) . |
| 5-152609 * | 6/1993 | (JP) ....................... 257/100 |
| 6-53554 * | 2/1994 | (JP) ....................... 257/100 |
| 6-232457 * | 8/1994 | (JP) ....................... 257/100 |

* cited by examiner

Primary Examiner—Olik Chaudhuri
Assistant Examiner—Wai-Sing Louie
(74) Attorney, Agent, or Firm—Brian D. Ogonowsky; Rachel V. Leiterman; Skjerven Morrill MacPherson LLP

(57) ABSTRACT

An LED component is provided, with light emission in the green-to-near UV wavelength range. The light-emitting semiconductor die is encapsulated with one or more silicone compounds, including a hard outer shell, an interior gel or resilient layer, or both. The silicone material is stable over temperature and humidity ranges, and over exposure to ambient UV radiation. As a consequence, the LED component has an advantageously long lifetime, in which it is free of "yellowing" attenuation which would reduce the green-to-near UV light output.

7 Claims, 2 Drawing Sheets

HIGH STABILITY OPTICAL ENCAPSULATION AND PACKAGING FOR LIGHT-EMITTING DIODES IN THE GREEN, BLUE, AND NEAR UV RANGE

FIELD OF THE INVENTION

The invention generally relates to the field of Light-Emitting Diode (LED) technology. More specifically, the invention relates to LED packaging and encapsulation.

BACKGROUND OF THE INVENTION

An LED component essentially comprises an LED chip (a piece of semiconductor material with appropriate wire leads) and a package (typically a substantially transparent material, configured in a dome shape, the dome acting as a lens for the emitted light).

The package must be rigid enough, at least on its exterior, to make the LED component structurally sound. On its interior, however, the package must be soft or resilient enough in the vicinity of the LED chip, that mechanical stresses do not damage the LED chip or the wire leads. Throughout, the transparent material of the package must keep light attenuation as small as possible, and must not adversely affect the spectrum of light which is emitted from the LED component.

Conventionally, it has been necessary to compromise between these different objectives. Materials such as PMMA (polymethylmethacrylate: acrylic or "plexiglas"), glass, polycarbonate, optical nylon, transfer molded epoxy, and cast epoxy have been used for encapsulation.

However, these materials suffer from the drawback that their optical transmissive characteristics degrade over time. As the material degrades, light is absorbed ("attenuation") to an increasing degree. In particular, light with shorter wavelengths, from the UV through the yellow, is absorbed. The result is called "yellowing", because the eye perceives the light, tending more toward longer wavelengths, as yellowish.

Note, incidentally, that there is also degradation due to decreased light output from the LED die itself.

Different LED components are configured for particular wavelengths of light. For instance, Red ($\geq$515 nm) and Yellow or Amber (~580–595 nm) LED technology are well-developed. By contrast, green through blue LEDs (400–570 nm) present design problems which have been more difficult to overcome.

Yellowing of the light-transmissive encapsulant material is not an issue for longer-wavelength Red, Amber, or Yellow LEDs. However, shorter-wavelength LEDs are particularly subject to attenuation because of yellowing.

Therefore, there is a need for an encapsulant for LEDs in the near UV, blue, and green range which avoids the drawbacks associated with yellowing and attenuation of the encapsulant material.

SUMMARY OF THE INVENTION

There is provided, in accordance with the invention, an LED component, for light of a wavelength in the green-to-near UV wavelength range, approximately 570 to 350 nm. The light-emitting semiconductor die is encapsulated with one or more silicone compounds, including a hard outer shell, an interior gel or resilient layer, or both. The silicone material is stable over temperature and humidity ranges, and over exposure to ambient UV radiation. As a consequence, the LED component has an advantageously long lifetime, in which it is free of "yellowing" attenuation which would reduce the green-to-near UV light output.

DETAILED DESCRIPTION OF THE PREFERRED EMBODIMENTS

Explanation of Terminology Used

In the discussion which follows, a naming convention will be used, in which the light-emitting semiconductor material itself is called an "LED chip" or an "LED die", and the overall packaged LED device, including the LED chip and the encapsulant, is called an "LED component."

Also, the verb "to encapsulate," and/or other forms of the word, including nouns, will be used in a broad, generic sense to refer to any way of enclosing the LED die, such that the enclosure protects and isolates the LED die from deleterious environmental effects, enhances light extraction from the LED die, and controls the external radiation patterns. An LED die may be encapsulated by placing a rigid cover over the die, by molding and curing a conformal material around the die into a predetermined shape, by a combination of the two, or by other techniques that would be known to persons skilled in the LED and the electrical component fields.

The optically transmissive cover will also be referred to as an "optic." The term "optic" broadly applies to any optically transmissive member. An optic may commonly be configured to refract light; that is, any lens may be referred to as an optic. However, an optic may also cause little or no refraction. For instance, a glass pane window is also an optic. The term "optic" applies to all embodiments of the optically transmissive cover presented herein, and to other embodiments of the invention which, given the present disclosure, a person skilled in the art would be aware of. In particular, the term "optic" applies to hard shell material, to softer, gel-type material, and to combinations of both.

It will be understood that optics are "optically transmissive." The term "optically transmissive" broadly covers transparency, translucency, transmissivity with dispersants, and other types of optical transmission.

Figure 1:
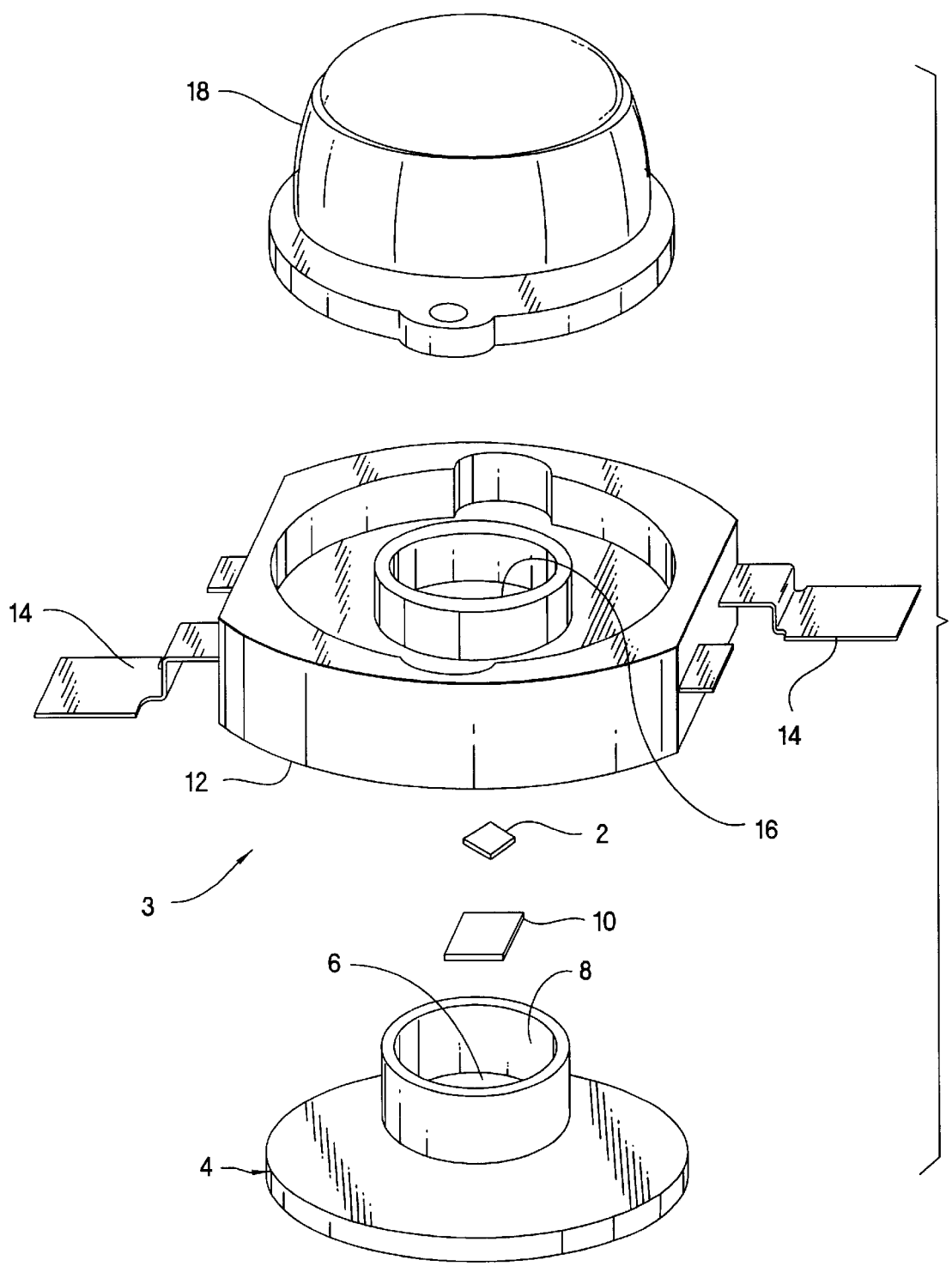
FIG. 1 is an exploded view of an LED according to the invention.

LED Structure—FIG. 1

FIG. 1 is an exploded view of an LED component. An LED die 2 is driven by electrical current from wire leads (not shown). Responsive to current flow, the LED die 2 emits light.

The LED die 2 is enclosed in a package which generally includes a bed arrangement 3 upon which the LED die 2 rests, and an optically transmissive cover, generally including a lens. The structure shown in FIG. 1 is exemplary, and a wide variety of other structures would be known to persons skilled in LED technology.

The bed arrangement 3 supports the LED die 2 and its leads. As shown, the bed arrangement 3 includes a lower housing member 4 which has a die placement area 6. The die placement area 6 may be substantially flat, or may be configured as a receptacle, as shown. A reflective surface 8 may be provided on the die placement area 6, to direct emitted light outward. A substrate member 10 may be positioned inside the die placement area 6, to support the die 2 itself.

The bed arrangement 3 also includes a lead support member 12, which is positioned over the lower housing member 4. Heavy leads 14, provided on the exterior of the LED component for incorporating the LED component into circuits and systems, are coupled through the lead support member 12 to fine leads (not shown), which couple directly to the LED die 2. The lead support member 12 includes an aperture 16, through which light emitted by the die 2 passes.

The Optically Transmissive Cover of an LED Component

An optically transmissive cover 18 is positioned over the bed arrangement 3, to cover and protect the LED die 2 and its leads. The cover 18 is made of one or more materials which are chosen for their light-transmissive properties, and for their stability over the environmental conditions under which the LED component is to operate. These environmental conditions include a wide range of temperatures (including Joule heating from operation) and ambient UV radiation. It is common practice to configure the cover 18 as a lens (generally in a convex shape) to direct the flow of light.

Conventionally, the optically transmissive cover 18 has been made of hard optical materials such as PMMA, glass, polycarbonate, optical nylon, transfer molded epoxy, and cyclic olefin copolymer.

For infrared (IR) (>940 nm) through Yellow-green (>560 nm) wavelength LED chips, silicone materials have been used to provide low stress junction coating during epoxy encapsulation, or used in conjunction with the above-listed hard optical materials.

For red monolithic display LEDs, silicone has also been used with no added hard materials in the optical path.

None of these conventional LED components, however, produced UV through Green light, so there was no need for overcoming the "yellowing" attenuation problem described above in connection with LED components of these wavelengths.

STATEMENT OF THE INVENTION

In accordance with the invention, silicone is used in the optically transmissive cover of an LED component which produces light in the green through near UV range.

Aside from the general indications of hardness or softness given below, a discussion of specific silicone formulations will be omitted. Persons skilled in the art will be able to select silicone formulations suitable for their own needs based on known silicone formulations and properties. See, for instance, Jacqueline I. Kraschwitz, Herman F. Mark, et al., "Encyclopedia of Polymer Science and Engineering" (2d ed.), New York: Wiley & Sons, (1985), vol. 15. In that reference, the chapter "Silicone" provides information applicable to the relevent aspects of the invention.

In the illustration of FIG. 1, the cover 18 is shown in simplified form. However, noteworthy features of covers such as the cover 18 will be described in detail below, in connection with embodiments of the invention. Most other details of the LED component structure, which are generally as described above, will be omitted from the illustrations of the embodiments of the invention.

The silicone encapsulant has advantageously stable optical transmission properties in the blue through green portion of the visible spectrum (400–570 nm). Because of the stability, light attenuation caused by changes in the material's light absorption properties is not a problem.

LED components according to the invention have been found to be stable over long lifetimes, greatly in excess of 1000 hours. Stability has been measured by exposure to low (−55° C.) through high temperatures (in excess of 100° C.), and low through high humidity (0–85% RH) operation. Stability also has been measured by exposure to high internal and external UV through green radiation, such as would be experienced during operation in outdoor environments.

Also, silicone has a high refractive index (~1.4 through 1.7), which makes silicone well-suited for optical refractive structures such as LED dome lenses.

Figure 2:
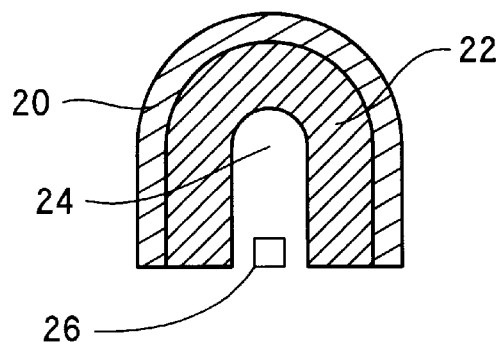
FIG. 2 is a cross-sectional view of an LED component according to a first embodiment of the invention.

First Embodiment—FIG. 2

FIG. 2 is a cross-sectional view of an LED optically transmissive cover structure, in accordance with a first embodiment of the invention.

Since it is common for LED covers to be shaped as lenses, the shape is given as a convex dome. Other shapes, however, will be known to those skilled in the art. Also, the position of the LED die is indicated, but it will be understood that leads and a suitable bed arrangement are also provided.

FIG. 2 shows an LED cover configured as per a first preferred embodiment of the invention. A hard outer shell 20 is suitably shaped, e.g., as a lens. The shell may be made of any suitable optically transmissive material, preferably a stable material such as cyclic-olefin copolymers or other optical plastics, glasses, ceramics, or other transparent materials such as Aluminum Oxide.

Inside the shell 20, a quantity of softer, resilient material 22 is provided. In accordance with the invention, the material 22 is a silicone compound.

Inside the silicone material 22 is a space 24, which may be a cavity or simply a region in the interior of the silicone material 22. The space 24 is occupied by an LED die 26. In accordance with the invention, the die produces light in the green through short UV range of wavelengths, and is therefore subject to light attenuation caused by any yellowing of the surrounding material. However, in accordance with the invention, the die 26 is surrounded by the silicone material 22, rather than a material which is prone to yellowing. Therefore, yellowing does not take place, and the LED component of the invention advantageously does not suffer from attenuation.

Figure 3:
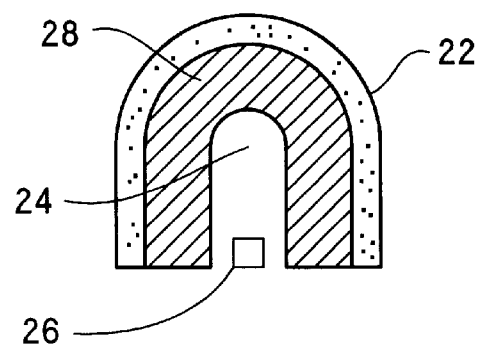
FIG. 3 is a cross-sectional view of an LED component according to a second embodiment of the invention.

Second Embodiment—FIG. 3

In the second embodiment of the invention, shown in FIG. 3, an LED die 26 (in the green-to-near UV wavelength range) is disposed inside a space 24, as before. Surrounding the LED die 26 is a structure including a hard outer shell and a softer interior. The interior is again a quantity of silicone material 28, such as a gel, similar to the material 22 of FIG. 2.

In this case, however, there is an outer shell 30 made of silicone material. Preferably, the outer shell 30 is a harder, more rigid silicone formulation than that of the material 28, to give the desired rigidity and structural integrity to the LED component.

Since the optically transmissive cover of FIG. 2 is entirely silicone material, it provides further advantageous freedom from yellowing attenuation.

Figure 4:
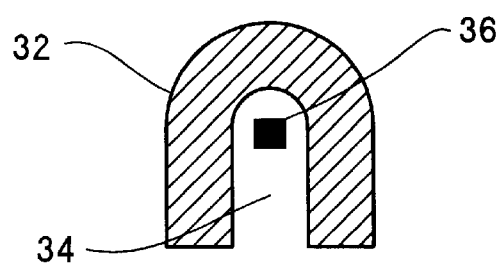
FIG. 4 is a cross-sectional view of an LED component according to a third embodiment of the invention.

Third Embodiment—FIG. 4

In yet another embodiment of the invention, the optically transmissive cover includes only a single layer of material.

As shown in FIG. 4, a cover made of a single, thick layer 32 of silicone material surrounds a cavity 34, in which an LED die 36 is disposed.

Other Embodiments of the Invention

From the description given above, persons skilled in the LED arts will foresee other embodiments that fall within the spirit and scope of the invention.

For instance, optical dispersants, such as scattering particles, may be embedded inside the optically transmissive cover, so that the LED component as a whole provides a more evenly balanced light. Such dispersants may be mixed into the silicone gel of FIGS. 2 and 3, or formed within the hard shells of any of FIGS. 2, 3, and 4.

Similarly, particles of light-emitting material, such as phosphor, may be embedded in the optically transmissive cover. Depending on the type of optically transmissive cover used (i.e., the various embodiments discussed above), the particles can be embedded either in the hard shell or in the softer interior silicone material. Responsive to excitation by radiation from the LED die, such particles emit light of a different wavelength from the radiation of the LED die.

In summary, the invention provides LED components in the green-to-near UV wavelength range, which are advantageously free of light attenuation due to yellowing or other forms of degradation of the optically transmissive lens and cover.

What is claimed is:

1. A light emitting diode (LED) component comprising:
   an LED chip emitting light having a wavelength in a range of 200 to 570 nanometers; and
   a package including a silicone optic encasing the LED chip comprising:
   an outer optically transmissive shell of rigid material; and
   a quantity of resilient, optically transmissive material inside the shell, comprising a silicone material being transmissive to light in the wavelength range from at least ultraviolet through green, wherein the silicone material maintains its transmissiveness when exposed to a temperature of 100° C.

2. A light emitting diode (LED) component comprising:
   an LED chip emitting light having a wavelength in a range of 200 to 570 nanometers; and
   a package including a silicone optic encasing the LED chip, the silicone optic comprising a silicone material being transmissive to light in a wavelength range from ultraviolet through green, wherein the silicone material maintains its transmissiveness when exposed to a temperature of 100° C.; and
   a light-emitting substance embedded in the silicone material, the light-emitting substance emitting light responsive to excitation by light of a predetermined wavelength, light emitted by the substance having a peak wavelength greater than the peak wavelength of light emitted by the LED chip.

3. The LED component as recited in claim 1, wherein the outer optically transmissive shell further comprises:
   a cavity, wherein
   the LED chip is disposed inside the cavity.

4. The LED component of claim 2, wherein a wavelength of the light emitted by the substance is in the range from 400 nanometers blue to 700 nanometers red.

5. The LED component of claim 2, wherein the light-emitting substance is selected from the group consisting of a phosphor and an organic dye.

6. The LED component of claim 1, wherein the silicone material maintains the stable absorption when exposed to 100° C. and any humidity.

7. The LED component of claim 1, wherein the silicone material maintains its transmissiveness when exposed to a temperature between 85° C. and 100° C. and a humidity of 85% RH.

\* \* \* \* \*